US011514989B2

(12) United States Patent
Kaynak et al.

(10) Patent No.: US 11,514,989 B2
(45) Date of Patent: Nov. 29, 2022

(54) DYNAMIC ADJUSTMENT OF OFFSET VOLTAGES FOR READING MEMORY CELLS IN A MEMORY DEVICE

(71) Applicant: Micron Technology, Inc., Boise, ID (US)

(72) Inventors: Mustafa N. Kaynak, San Diego, CA (US); Sivagnanam Parthasarathy, Carlsbad, CA (US); Patrick Robert Khayat, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/013,423

(22) Filed: Sep. 4, 2020

(65) Prior Publication Data
US 2022/0076760 A1  Mar. 10, 2022

(51) Int. Cl.
*G06F 11/00* (2006.01)
*G11C 16/26* (2006.01)
*G06F 3/06* (2006.01)
*G11C 16/34* (2006.01)
*G11C 16/04* (2006.01)

(52) U.S. Cl.
CPC ............ *G11C 16/26* (2013.01); *G06F 3/0604* (2013.01); *G06F 3/0659* (2013.01); *G06F 3/0679* (2013.01); *G11C 16/349* (2013.01); *G11C 16/0483* (2013.01)

(58) Field of Classification Search
CPC . G11C 11/5642; G11C 16/0483; G11C 16/26; G11C 16/28
See application file for complete search history.

(56) References Cited

U.S. PATENT DOCUMENTS 8,797,803 B2   8/2014  Radke et al.
2018/0261296 A1*  9/2018  Choi ................... G11C 16/3431

* cited by examiner

*Primary Examiner* — Yong J Choe
(74) *Attorney, Agent, or Firm* — Greenberg Traurig (57) ABSTRACT

A memory device to manage the assignment of offset voltages for read operations, and to adjust read voltages using the offset voltages. The offset voltages are dynamically adjusted by a controller during operation of the memory device in response to read errors. In one approach, a first bin of offset voltages is assigned to a first region of a storage media. The first offset voltages are used to adjust read voltages for reading a page of first memory cells in the first region. The controller determines that at least one error has occurred in reading the page. In response to determining the error, the controller determines second offset voltages that can be used to read the first memory cell without causing a read error. Based on the second offset voltages, the controller identifies third offset voltages for assigning to the first region. The third offset voltages are used for adjusting read voltages for subsequent reads of pages in the first region. The third offset voltages can be assigned from an existing offset voltage bin, or a new offset voltage bin can be generated for the assignment.

20 Claims, 6 Drawing Sheets

DYNAMIC ADJUSTMENT OF OFFSET VOLTAGES FOR READING MEMORY CELLS IN A MEMORY DEVICE

FIELD OF THE TECHNOLOGY

At least some embodiments disclosed herein relate to memory systems in general, and more particularly, but not limited to memory systems configured to determine offset voltages used to adjust read voltages when reading memory cells of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to a memory sub-system configured to read data from memory cells using read voltages adjusted by offset voltages that are selected by a controller based on the particular memory cells to be read (e.g., the offset voltages are dynamically configured for the memory cells of a memory block during the operation of a flash memory device as read performance is observed and/or tested by the controller). Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Data is generally retrieved from memory devices by performing memory read operations. Sometimes the memory read operations need to be adjusted to read data correctly. For example, data can be retrieved from a memory device using read commands. However, in some cases the data is not read properly when the read command is executed, which results in read errors. In one example, a read error occurs due to storage charge loss (SCL) for memory cells that occurs with time (e.g., storage charge loss is log-linear with time). The storage charge loss causes a shift in the optimal read voltage for reading the memory cells.

Some memory sub-systems use a fixed number of bins and bin offsets for adjusting read operations and the number of bins and corresponding offsets voltages per bin are pre-determined ahead of time. In one example, read voltages are applied to memory cells to read data from memory cells. After continued use, the memory cells may need to be read using lower read voltages. In some memory sub-systems, after a fixed or certain period of time has passed since data has been written to a region of a memory device, a fixed set of voltage offsets (e.g., as implemented using offset voltage bins) are subtracted from read voltages to read the memory cells in that region. However, such static assignment of offset voltages may not provide sufficient flexibility in managing read operations. This can result in excessive read errors when system uses very few bins that result in very coarse granularity of offset voltages, and/or a need for extra memory device resources to manage the read operations if a system uses more bins than are required for practical operation. Furthermore, the memory cells have more margin for error when they have been erased/programmed smaller number of times whereas margin for error is a lot smaller when they have been erased/programmed large number of times. Using an unchanging, constant number of bins for these cases is not efficient.

At least some aspects of the present disclosure address the above and other deficiencies by using dynamically adjusted offset voltages when reading memory cells. In some embodiments, the execution of read commands is dynamically adjusted by adjusting read voltages based on assigned sets of offset voltages among various sets (e.g., bins of offset voltages, as described below) each of which corresponds to different SCL regions (e.g., an extent of SCL as determined by a controller that uses test read operations to determine changes in read error rates for a block). In one example, an offset voltage manager handles assignment of offset voltage bins to blocks of a memory device, and further handles adjusting read voltages when a read is performed (e.g., a read of a page in a block). This can improve read accuracy and reduce the problem of read errors exhibited by existing memory systems.

In one embodiment of a memory device, base read voltages (e.g., starting read voltages for the first use of a device) are set, which correspond to reads for memory cells having little or no SCL. The base read voltages can be set during manufacture of the memory device (e.g., a memory storage product). A controller then subtracts offset voltages from these read voltages depending on the SCL for a block in which a read is being performed. This is accomplished through selecting the offset voltages from a bin to which the block has been assigned. For example, for a recently-programmed block the offset voltages subtracted from the read voltages will be fairly small (in the case when using negative offset voltages, the offsets are added to the read voltages to provide reduced read voltages). In contrast, a block that has been programmed a long time ago will use larger offset voltages.

In one embodiment, several offset voltage bins are stored in a table of a memory device. One of these bins is assigned by a controller of the memory device (e.g., see offset voltage manager 143 of FIG. 1 below). The controller implements a process to determine storage charge loss for the memory device. The process can be implemented, for example, using background and/or foreground operations.

Each bin stores a set of offset voltages. Each offset voltage corresponds to a valley of multiple valleys when reading a memory cell. For example, a triple-level cell has seven such valleys (e.g., valley 1-7). In one example, a read operation involves reading one or more pages. Each page is associated with multiple valleys. During the read operation, the controller determines an offset voltage bin that has been assigned to the block containing the pages to be read. The offset voltages of the determined bin are used to adjust the respective read voltages used to read a page with multiple valleys.

As the extent of storage charge loss increases with time, the controller manages reassignment of blocks from an existing bin to a new bin. Various inputs can be used to determine when the reassignment is performed. These inputs can include, for example, time and/or temperature. In one example, the controller determines whether reassignment should be performed after a defined time period has passed (e.g., a time period in the range of 15-60 minutes).

In another example, the controller determines where the reception performed after a temperature of the memory device has changed by more than a defined quantity (e.g., a temperature change in the range of 5-15 degrees Celsius). Storage charge loss increases with higher temperatures. In one example, the controller can determine a temperature using a temperature sensor. In one example, the temperature is a package temperature or a junction temperature. The controller can determine the temperature repeatedly for a given time interval (e.g., 1-5 minutes).

Based on various inputs, such as time and/or temperature, the controller determines to perform a reassignment operation. In one example, a bin table (e.g., stored in flash memory) managed by the controller contains eight bins. Read operations for a block or page(s) from the block are performed using offset voltages from each of the eight bins. As each read operation is performed, the controller determines an error rate associated with the read operation. The controller determines which bin resulted in the lowest number of errors (e.g., lowest raw bit error rate). Then, the controller reassigns the block to that bin. Subsequent read operations to that block will use the reassigned bin.

The controller then repeats the above process for other blocks of the memory device. Typically, blocks that have been recently programmed will be assigned to a bin that has smaller offset voltage magnitudes. In contrast, blocks for which significant time has passed since being programmed will be assigned to a bin that has larger offset voltage magnitudes.

In one embodiment, the controller can manage blocks in groups of blocks. For example, this may be done to reduce required processing resources. Resource requirements typically would be significant if the reassignment process and its read operations were performed for each block. Instead, the read operations for the reassignment process can be performed for one block, or a subset of the blocks, in a group. Then, the bin reassignment used for the tested blocks can be applied to all blocks in the group. In one example, the controller can group of blocks together that have been programmed in a similar range of time. In one example, the controller can additionally and/or alternatively group blocks together that have been programmed and/or operated in a similar temperature range. Other approaches can also be used to assign blocks to bins that reduce the error rate associated with read operations.

In one embodiment, a controller of the memory device manages a process to determine when a voltage resolution of the bins available to the controller for assignment to blocks, such as described above, should be increased. For example, a controller may initially store three bins used for adjusting read voltages. However, as dynamic bin management occurs over time, the number of bins increases incrementally to eight bins.

In one embodiment, during a read operation, a controller determines that one or more errors has occurred that causes the read operation to fail. The controller determines one or more offset voltages that were used for reads to recover the data. If the offset voltages that avoid the error are more than a predetermined voltage difference from any of the existing bins, then the controller creates one or more new bins.

In one example, a new bin is created based on the offset voltages for each valley that avoided the error. In one example, offset voltages are selected for the new bin so that the voltage difference between each offset voltage for a valley that avoided the error, and the corresponding new offset voltage for the valley in the new bin is less than a predetermined voltage difference.

In some cases, after a read failure occurs, the controller determines that an existing bin is suitable for use in future read operations for a block. In such cases, the controller may determine that there is no need to generate any new bins.

In one embodiment, a memory device adjusts read voltages based on offset voltages selected by a controller. The offset voltages are dynamically adjusted by the controller during operation of the memory device in response to read errors. In one approach, first set of offset voltages (e.g., selected from a coarse offset voltage bin) is assigned to a first region (e.g., a certain memory block) of a storage media. The first set of offset voltages is used to adjust read voltages for reading first memory cells in the first region (e.g., reading a page in a block). As an example, for TLC memory with 7 valleys between 8 data states, each set of offset voltages has an offset voltage for each valley. The controller determines that an error has occurred in reading the first memory cells.

In response to determining the error, the controller determines a second set of offset voltages that can be used to read the first memory cells (e.g., page or pages) without causing a read error (e.g., when read voltages are adjusted using the second set of offset voltages, then no read error occurs). Based on this second set of offset voltages, the controller identifies a third set of offset voltages for assigning to the first region. The third set of offset voltages (e.g., the third set of offset voltages is included in a fine offset voltage bin that is assigned by the controller to the certain memory block) is used for adjusting read voltages for subsequent reads of memory cells in the first region.

In one example, a memory region is assigned a coarse offset voltage bin (e.g., coarse offset voltage bins have higher offset voltage differences for each valley between bins than voltage differences for each valley between fine offset voltage bins). When memory cells in that region exhibit one or more read errors (e.g., as determined during error correction handling), a set of coarse offset voltage bins can be dynamically reconfigured to provide a new set of fine offset voltage bins (e.g., the fine offset voltage bins have a lower voltage difference between bins). The new fine offset voltage bins are then assigned to one or more memory regions (e.g., memory blocks) of the memory device. This includes assigning a new fine offset voltage bin to the memory region that included the memory cells for which the read errors occurred.

In one example, fine offset voltage bins are configured by a controller to have more granularity than coarse offset voltage bins. The finer granularity provides more precise control of read voltages when needed to avoid or reduce read errors. For example, read voltages can be adjusted with more precision due to the lower voltage differences between the fine offset voltage bins. Dynamically changing from coarse granularity (e.g., as initially used by a new memory device) to fine granularity as later needed during operation (e.g., after the memory device ages and suffers from significant storage charge loss) can reduce read errors, and also reduce the amount of memory system resources required to manage read operations given that the system switches to finer granularity offset voltages only when needed, which prevents or reduces unnecessary use of system resources.

Figure 1:
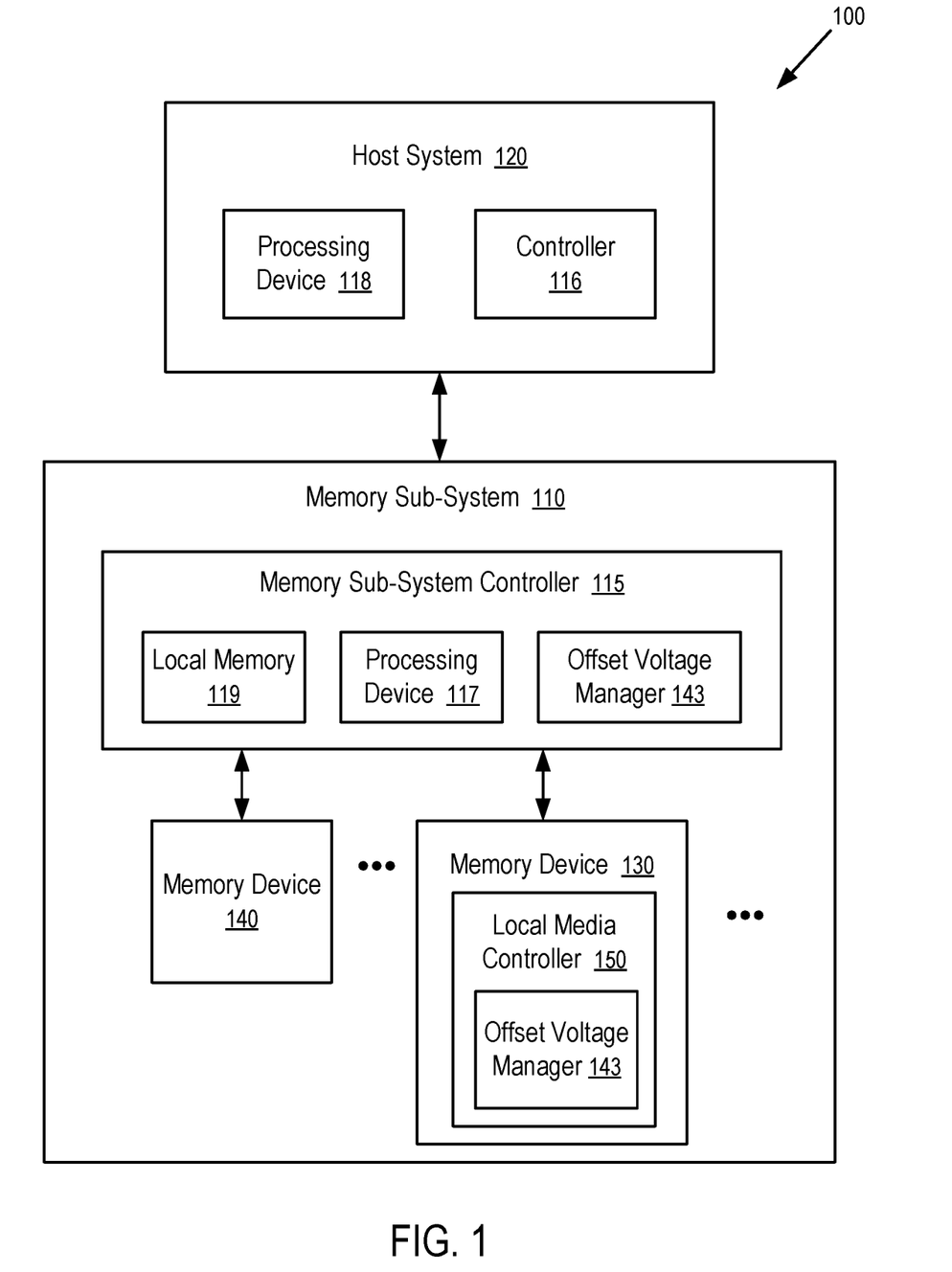
FIG. 1 illustrates an example computing system having a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include offset voltage manager 143 to dynamically assign offset voltages to memory regions based on monitoring the effects of storage charge loss, and then to use the assigned offset voltages (e.g., stored in offset voltage bins in a table) for each memory region (e.g., a group of blocks) to adjust read voltages when reading the respective memory region. In some embodiments, the controller 115 in the memory sub-system 110 includes at least a portion of the offset voltage manager 143. In other embodiments, or in combination, the controller 116 and/or the processing device 118 in the host system 120 includes at least a portion of the offset voltage manager 143. For example, the controller 115, the controller 116, and/or the processing device 118 can include logic circuitry implementing the offset voltage manager 143. For example, the controller 115, or the processing device 118 (processor) of the host system 120, can be configured to execute instructions stored in memory for performing the operations using the offset voltage manager 143 described herein. In some embodiments, the offset voltage manager 143 is implemented in an integrated circuit chip disposed in the memory sub-system 110. In other embodiments, the offset voltage manager 143 can be part of firmware of the memory sub-system 110, an operating system of the host system 120, a device driver, or an application, or any combination therein.

For example, offset voltage manager 143 implemented in the controller 115 can adjust read voltages used to read data from memory device 130 or 140. For example, adjusting read voltages using offset voltage manager 143 can compensate for storage charge loss in memory cells of memory device 130 or 140, thus resulting in fewer read errors.

Figure 2:
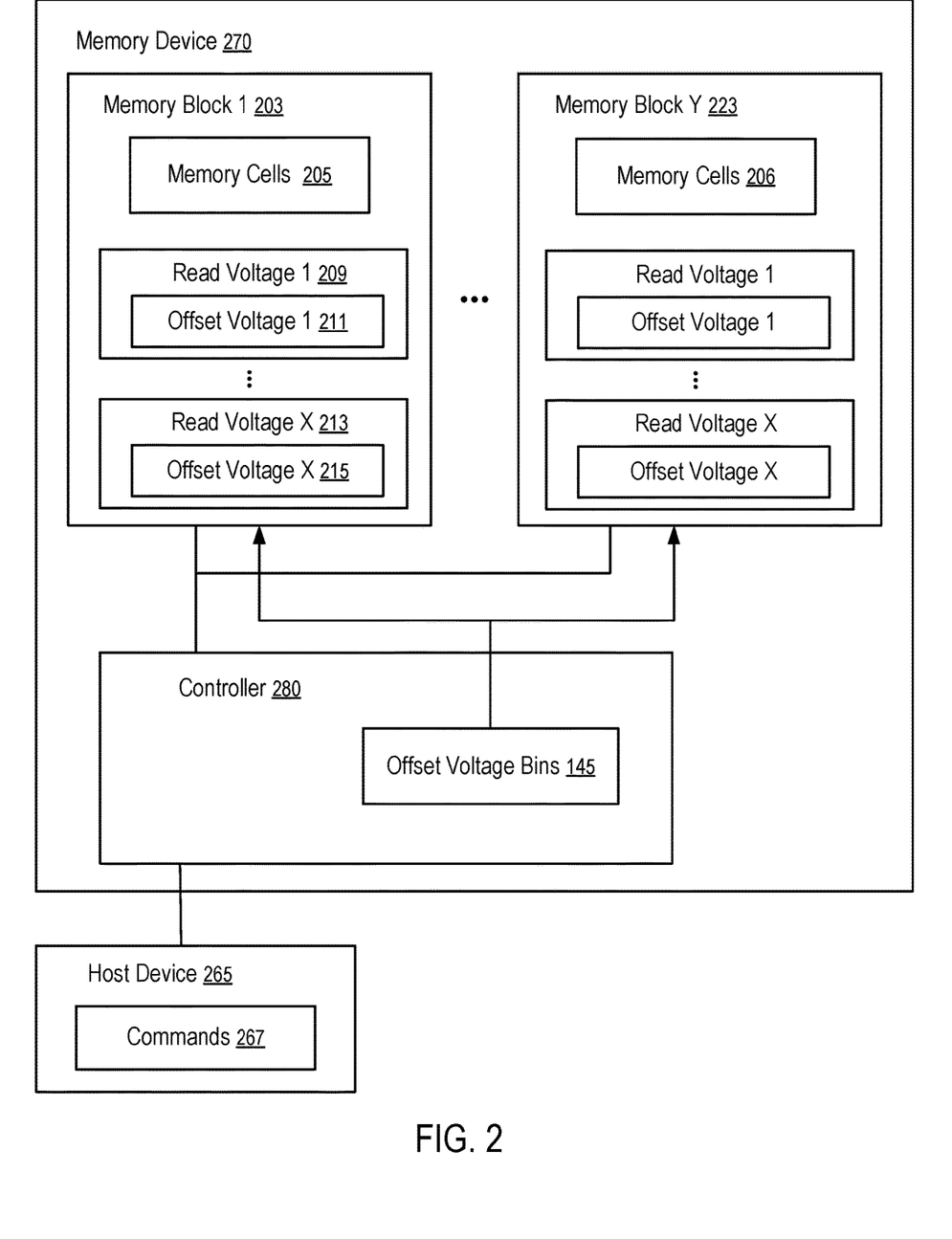
FIG. 2 shows a memory device configured for reading data using offset voltages, according to one embodiment.

FIG. 2 shows a memory device 270 configured to read data using offset voltages, according to one embodiment. Memory device 270 includes controller 280. Controller 280 may be, for example, an embedded processor, embedded controller, microcontroller, central processing unit (CPU), processing core, execution unit, or other processing device. Memory device 270 is an example of memory device 130. Controller 280 is an example of local media controller 150.

Controller 280 manages offset voltage bins 145. In one example, offset voltage bins 145 are assigned by offset voltage manager 143 of FIG. 1. In one example, controller 280 selects one of offset voltage bins 145 when a read command is received from a host device 265.

In one embodiment, memory device 270 includes at least one storage media with at least one memory array. The memory array may be subdivided into smaller units. For example, the memory array may include one or more regions. In one example, the regions are memory blocks 1-Y 203-223. Memory block 1 203 includes memory cells 205 (e.g., which correspond to a page or pages of data), which are read using read voltages 1-X 209-213 (e.g., each read voltage corresponds to a valley of a TLC memory) as adjusted by offset voltages 1-X 211-215. Memory block Y 223 and memory block 1 203 are similar in structure. Memory block Y 223 includes memory cells 206, which are read using read voltages 1-X as adjusted by offset voltages 1-X.

The memory blocks 1-Y 203-223 may be subdivided into pages (not shown) with each page including a plurality of memory cells (e.g., memory cells 205). In one example, memory device 270 is a flash memory device, and memory blocks 1-Y 203-223 are memory blocks within the flash memory device. In one example, memory cells 205 are fabricated as planar arrays of memory cells. In one example, memory cells 205 are fabricated as three-dimensional arrays of memory cells.

In one embodiment, a host device (e.g., host device 265) is coupled to memory device 270. In one example, host device 265 is host system 120 of FIG. 1. Host device 265 may be, for example, a computer, embedded computer, server, cloud server, edge server, laptop, tablet, smartphone, or other electronic device controlled by a processing device.

In one embodiment, host device 265 issues commands (e.g., commands 267) to memory device 270 to access data in memory device 270. Commands 267 may include, for example, write commands to write data into memory device 270, read commands to read data from memory device 270, and erase commands to erase memory blocks within memory device 270. In one example, controller 280 receives and executes commands 267 from host device 265.

In one embodiment, data is stored in a memory cell by storing electrical charge in the memory cell. Data is read from the memory cell by applying one or more read voltages (e.g., read voltages 1-X 209-213) to the memory cell and reading the value stored in the memory cell. In one example, a memory cell that stores one "bit" of data (e.g., an SLC memory cell) will have two possible data states "1" and "0". A read voltage positioned between these two states can differentiate the two states to read the data value. A memory cell that stores two bits of data (e.g., an MLC memory cell) will have four possible data states "11", "10", "00" and "01". Three read voltages positioned between each of the four possible states are needed to read the data value. A memory cell that stores three bits of data (e.g., a TLC memory cell) will have eight possible data states which requires seven read voltages, etc. In one example, for each possible data state there is an optimal voltage to read a memory cell to most accurately determine the memory cell data value resulting lowest possible error rate. In one example, memory cells 205 are configured to be programmed in a MLC, TLC, or QLC mode.

In one example, a memory cell may lose some of the charge stored in the memory cell. This is sometimes described as storage charge loss (SCL). As a memory cell loses charge, the read voltages that need to be applied to the memory cell to differentiate one data value from another may change. In one example, a memory cell storing two bits of data may have three read voltages (e.g., 1.00 volts for the valley between state-11 and state-01, 2.00v for the valley between state-01 and state-00, 3.00v for valley between state-00 and state-10). As the memory cell loses charge, the read voltages (e.g., 1.00v, 2.00v, 3.00v) may not accurately read the correct data values (e.g., causes significant bit errors). The read voltages may need to be adjusted (e.g., 0.95 volts, 1.90v, 2.85v) to accurately read the data value in the memory cell.

In one embodiment, offset voltages (e.g., offset voltages 1-X 211-215) are provided to memory block 1 203. In one example, offset voltages 1-X 211-215 are subtracted from read voltages 1-X 209-213 to provide adjusted read voltages. In one example, read voltage 1 209 is 3.00 volts, offset voltage 1 211 is 0.15 volts, and adjusted read voltage 1 is 2.85 volts. In another example, read voltage X 213 is 1.00 volt, offset voltage X 215 is 0.05 volts, and adjusted read voltage X is 0.95 volts, etc. In one example, for each page read, there will be one or more read voltages depending on the number of valleys for the page read. Furthermore, the number of offset voltages will match the number of read voltages.

In one embodiment, controller 280 provides offset voltages to memory blocks 1-Y 203-223. A maximum amount of SCL per valley between two data states (or levels) for memory device 270 is identified, and offset voltage bins (e.g., offset voltage bins 145) are defined with each offset voltage bin representing a portion of the maximum amount of SCL for memory device 270. The maximum offset voltage used for any given valley will typically be stored in the bin generally containing the largest offset voltages (and used for the greatest extent of SCL). In one example, the maximum amount of SCL for valley-7 (between data state-6 and data state-7) is 400 millivolts. Offset voltage bins 145 for valley-7 may be defined, for example, with one bin as 400 millivolts maximum, another bin as 200 millivolts maximum, and another bin as 0 millivolts. Offset voltage bins for other valleys are defined similarly. Memory blocks 1-Y 203-223 are each assigned to receive offset voltages from one of the offset voltage bins. In one embodiment, offset voltage bins 145 are managed by memory sub-system controller 115. In one embodiment, offset voltage bins 145 are partially managed by controller 280 and partially managed by memory sub-system controller 115.

In one embodiment, when implementing offset voltage management, controller 280 may operate in various modes. In one mode, both the offset voltages and the read voltages are internal to memory device 270. The block to be read is used by controller 280 to determine which offset voltage bin will be used. In one example, a lookup table is used by controller 280 to determine the offset voltage bin assigned to the block to be read.

In another mode, the read voltage is internal to memory device 270, but the offset voltages to be used are indicated in the read command received from host device 265. In one example, host device 265 indicates to the controller 280 which of bins 145 is to be selected for use in executing a read command.

In yet another mode, the read voltages and the offset voltages to be used for read operation are provided with the read command from host device 265.

In one embodiment, controller 280 is configured to receive command 267 from host device 265 to read data stored in memory block 1 203. The offset voltages 1-X 211-215 are determined in response to receiving command 267. This is accomplished by first finding which voltage bin the block has been assigned to. Then, corresponding offset voltages are read from a bin offset table (wherever the offset voltages are stored). In one example, the bin offset table stores offset voltage bins 145 in flash memory.

Figure 3:
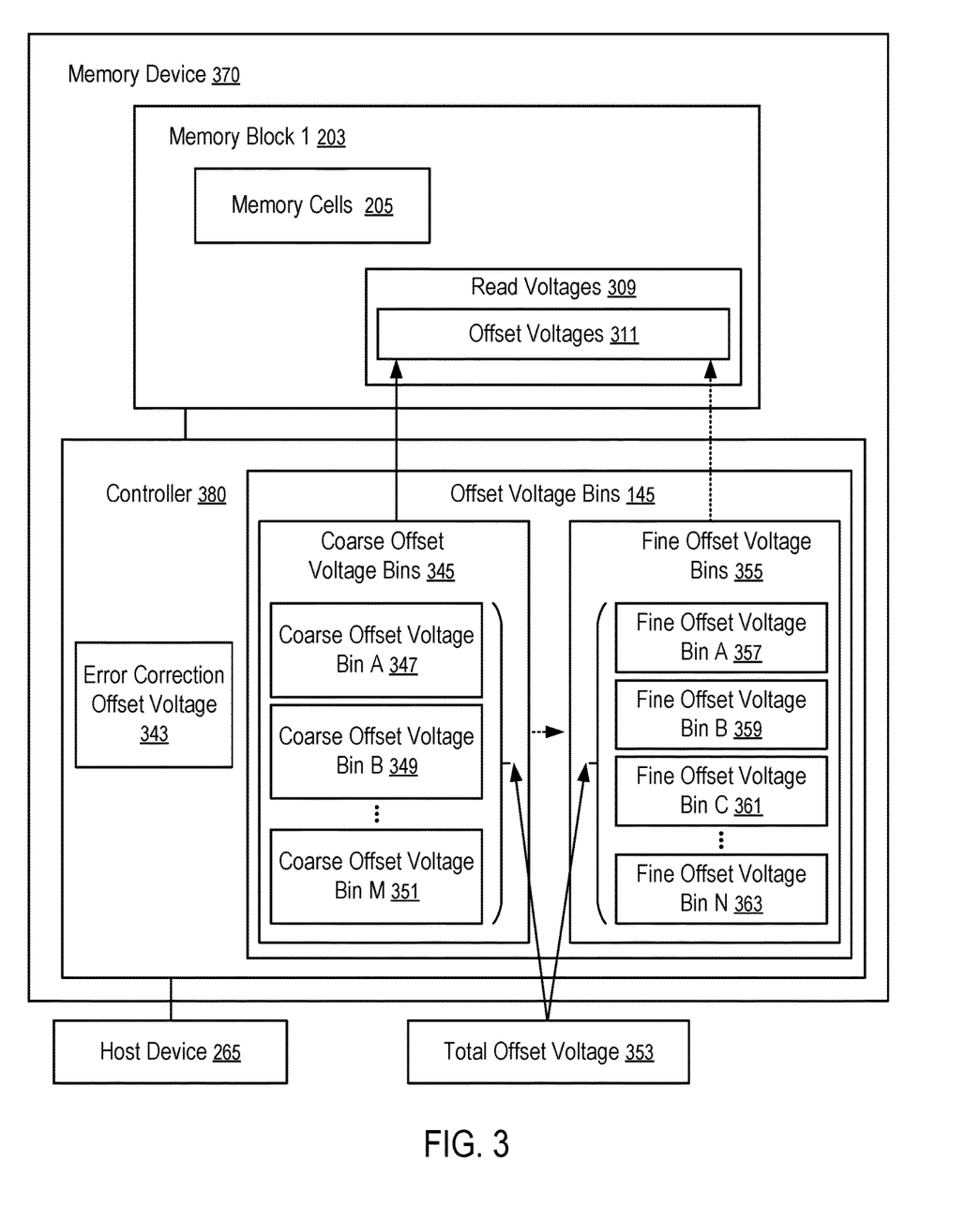
FIG. 3 shows a memory device configured for reading data using coarse offset voltages and fine offset voltages, according to one embodiment.

FIG. 3 shows a memory device 370 configured to read data using coarse offset voltages and fine offset voltages, according to one embodiment. Memory device 370 includes controller 380. Memory device 370 is an example of memory device 130, and controller 380 is an example of local media controller 150. Controller 380 receives read commands from host 265.

Offset voltages are used to adjust read voltages, and memory cells in a region are read using the adjusted read voltages. In one example, offset voltage bins 145 are implemented initially as coarse offset voltage bins. As new bins are generated and added for assignment, the coarse offset voltage bins are transformed into fine offset voltage bins. In one example, coarse offset voltage bins 345 are defined, and each memory block is assigned to receive offset voltages 311 from one of the coarse offset voltage bins 345. When read errors are encountered, fine offset voltage bins 355 are provided by adding one or more new bins, and the memory blocks are reassigned to receive offset voltages from the fine offset voltage bins 345. It should be noted that FIG. 3 illustrates coarse bins 345 and fine bins 355 for purposes of illustration. In a typical memory device, there will be a single bin table. In one example, the bin table initially contains 3 coarse bins. As time passes during operation, additional bins are added to the table. In one example, the bin table eventually contains eight fine bins.

In one embodiment, the definitions of coarse offset voltage bins and fine offset voltage bins are based on the maximum amount of SCL per valley for memory device 370. In one example, the maximum amount of SCL per valley is determined through characterization of memory device 370. Memory blocks within memory device 370 may exhibit different amounts of SCL. For example, an amount of SCL for a memory block may be affected by the duration of time since the memory block was last erased, temperature conditions for the memory block, the number of program/erase cycles associated with the memory block, etc. In one example, the SCL for memory block 1 203 is determined prior to receiving commands 267, and the magnitude of the coarse offset voltage bin selected for memory block 1 203 is based on the SCL for memory block 1 203.

In one embodiment, a total offset voltage (e.g., total offset voltage 353) is equal to the maximum SCL for memory device 370 for each valley. For example, if the maximum SCL for memory device 370 is 300 millivolts for valley-n, total offset voltage 353 is set to 300 millivolts and this value is subtracted from read voltage for valley-n. The maximum SCL is determined for each valley. For example, there are seven maximum SCLs determined (one SCL per valley) for TLC memory.

In one embodiment, the total offset voltage 353 is divided into bins (e.g., coarse offset voltage bins 345). In one example, each bin (e.g., coarse offset voltage bin A 347, coarse offset voltage bin B 349, . . . coarse offset voltage bin M 351) includes a series of offset voltages for reading memory cells 205 corresponding to offset voltages 1-X 211-215 of FIG. 2. Memory blocks 1-Y 203-223 of FIG. 2 are each assigned to receive offset voltages 1-X 211-215 from one of the coarse offset voltage bins 345. In one example, total offset voltage 353 is, for example, 400 millivolts for valley-n. In this example, for valley-n the maximum offset in coarse offset voltage bin A 347, coarse offset voltage bin B 349, . . . coarse offset voltage bin M 351 may be set to, for example, 400 millivolts, 200 millivolts, and 0 millivolts respectively. In one example, for TLC memory, a first bin will have seven offset voltages, one for each valley. Second through seventh bins will similarly each have seven offset voltages, one for each valley.

In one example, offset voltages 311 and read voltages 309 of FIG. 3 are offset voltages 1-X 211-215 and read voltages 1-X 209-213 of FIG. 2, respectively.

In one example, the SCL within memory cells 205 of memory block 1 203 will continue to increase (e.g., due to increased number of program/erase cycles, time since memory block 1 203 was last erased, temperature, etc.). As the SCL for memory block 1 203 increases, the coarse offset bin assigned to memory block 1 203 may not be sufficient to adjust read voltages 309 adequately to correctly read data from memory cells 205, which results in read errors.

In one embodiment, read errors are handled by an error correction module of controller 380 (not shown) (e.g., the error correction module can be implemented by logic circuitry and/or firmware). In one example, the error correction module re-reads the memory cells that generated the read error using different offset voltage values other than the coarse offset voltages assigned to the memory block. In one example, the error correction module finds at least one set of offset voltages (e.g., error correction offset voltage 343) that correctly reads the memory cell that generated the error, and the read cycle is completed.

In one embodiment, error correction offset voltage for valley-n 343 may be compared to the respective one of coarse offset voltage bins 345 for valley-n (e.g., coarse offset voltage bin A 347, coarse offset voltage bin B 349, . . . coarse offset voltage bin M 351). In one example, error correction offset voltage 343 for a valley-n is within a predetermined range (e.g., 50 millivolts) of a coarse offset voltage bin for valley-n, and memory block 1 203 is re-assigned to receive offset voltages 311 from the coarse offset voltage bin most closely matching error correction offset voltage 343.

In one example, memory block 1 203 is initially assigned to receive offset voltages 311 from, for example, coarse offset voltage bin M 351 (e.g., 0 millivolts) for valley-n. In this example, a read error is generated during a read operation. An error correction offset voltage 343 is determined (e.g., 160 millivolts) for valley-n, and memory block 1 203 is re-assigned to receive offset voltages 311 from, for example, coarse offset voltage bin B 349 (e.g., 200 millivolts) for valley-n.

In one example, error correction offset voltage 343 is not within the predetermined range of any coarse offset voltage bins, and thus in response to this situation, a set of fine offset voltage bins (e.g., fine offset voltage bins 355) is provided by generating new bins to add to the existing bins.

In one example, offset voltages 311 that are closest to error correction offset voltage 343 are selected from fine offset voltage bins 355 and assigned to memory block 1 203 for reading memory cells 205. In one example, the fine offset voltage bins 355 are based on the total offset voltage 353. In one example, fine offset voltage bins 355 include a larger number of bins (e.g., five bins) than coarse offset voltage bins 345 (e.g., three bins). In one example, fine offset voltage bins 355 have finer granularity (e.g., 100 millivolts) than coarse offset voltage bins 345 (e.g., 200 millivolts). In one example, total offset voltage 353 is 400 millivolts for valley-n, and fine offset voltage bins 355 (e.g., fine offset voltage bin A 357, fine offset voltage bin B 359, fine offset voltage bin C 361, . . . fine offset voltage bin N 363) are set to, for example, 400 millivolts, 300 millivolts, 200 millivolts, . . . 0 millivolts, respectively for valley-n. In one example, offset voltages 311 that are closest to error correction offset voltage 343 are selected from fine offset voltage bins 355.

In one example, error correction offset voltage 343 is not within the predetermined range (e.g., 50 millivolts) of any coarse offset voltage bin, and providing of additional new fine offset voltage bins is delayed until a predetermined number of read errors have occurred (e.g., 1,000 read errors). In one example, once a predetermined number of read errors have occurred, fine offset voltage bins 355 are provided, and offset voltages are selected from one of the fine offset voltage bins 355.

In one embodiment, the decision to split coarse offset voltage bins 345 into fine offset voltage bins 355 is based on read errors caused by storage charge loss and not on other types of read errors (e.g., read errors caused by program disturb, etc.).

In one example, storage charge loss is determined for a group of blocks of memory cells 205 of memory device 370, and selecting a fine offset voltage bin is based on the extent of the storage charge loss for a representative one of the blocks.

In one example, assigning coarse offset voltage bins 345 to memory blocks (and when needed re-assigning fine offset voltage bins 355 to the memory blocks) may reduce overall memory sub-system resource requirements. For example, using coarse offset voltage bins may require less time and resources to store and find the offset bin per memory block for each read request than using fine offset voltage bins. In one example, a larger number of fine offset voltage bins than coarse offset voltage bins may result in fine offset voltage bins requiring more memory to store offset bin assignments. In one example, each fine offset voltage bin covers a smaller amount of the total offset voltage 353, which may result in memory blocks being re-assigned to fine offset voltage bins more frequently (e.g., a background scan assigning coarse offset voltage bins 345 to memory blocks may run every 60 minutes, whereas a background scan assigning fine offset voltage bins 355 to memory blocks may run every 15 minutes).

In one embodiment, assigning coarse offset voltage bins 345 (and re-assigning fine offset voltage bins 355 when needed) is used when quality of service (QoS) requirements on memory sub-system 110 are not stringent (e.g., mobile computing, embedded computing, etc.).

Figure 4:
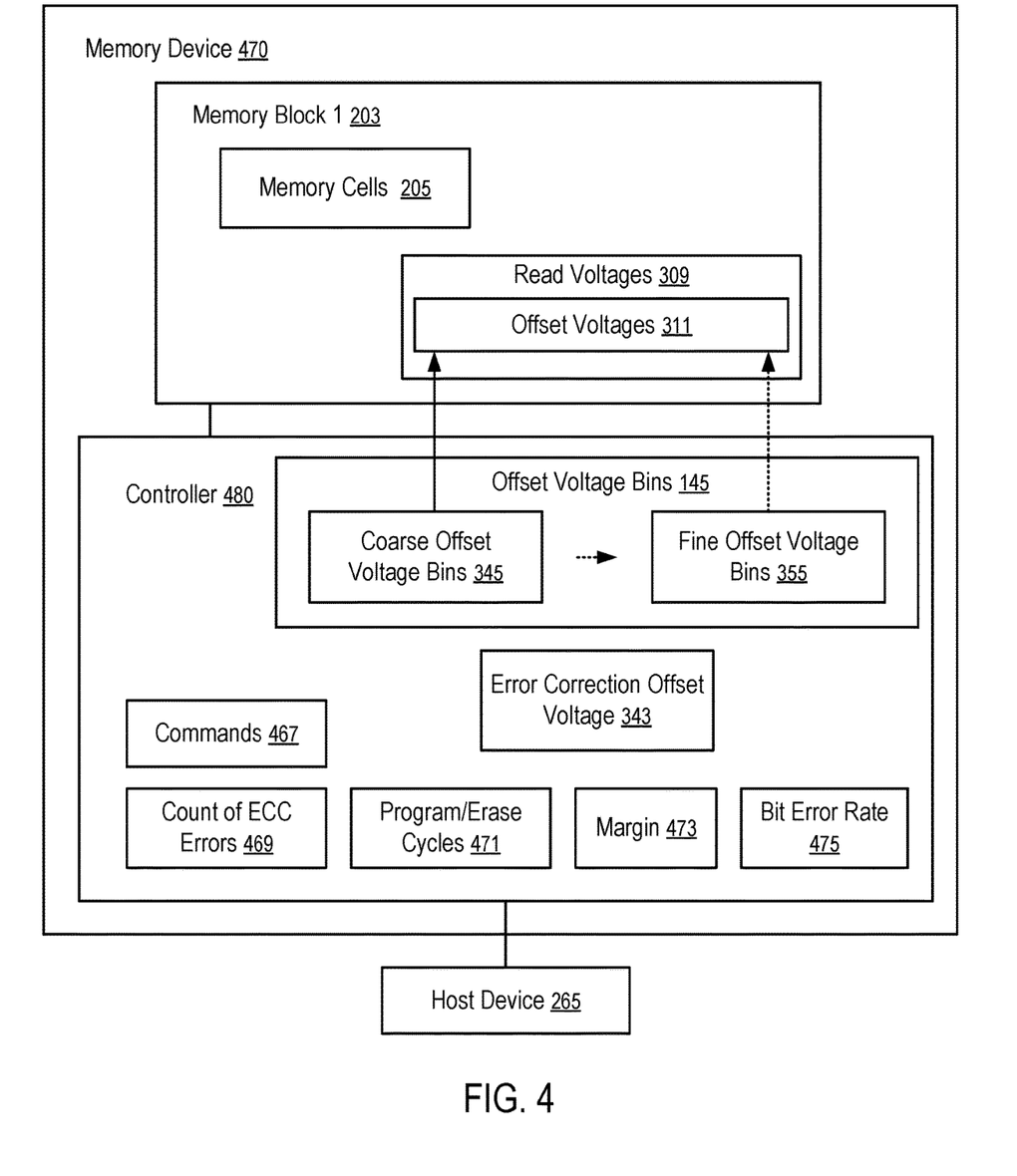
FIG. 4 shows a memory device configured to dynamically adjust coarse and fine offset voltages used for reading data, according to one embodiment.

FIG. 4 shows a memory device 470 configured to dynamically adjust coarse and fine offset voltages used for reading data, according to one embodiment. Memory device 470 includes controller 480 that receives commands 467 from host device 265. Memory device 470 is an example of memory device 130, and controller 480 is an example of local media controller 150.

In one embodiment, assigning coarse offset voltage bins 345 (or fine offset voltage bins 355 if new bins have been added) is disabled until at least one read error is determined to have occurred for a block. For example, a memory block that has recently been erased may exhibit only a small extent of SCL, and offset voltages 311 may not be needed to correctly read data in the memory block.

In one embodiment, assigning a new offset voltage bin is disabled until a count of ECC errors (e.g., count of ECC errors 469) reaches a predetermined threshold (e.g., a fixed error count). In one example, an ECC error (ECC error event) happens when a read fails in the first attempt at ECC decoding. In one example, a count of ECC errors means the number of read fails. In one example, memory block 1 203 is assigned a coarse offset voltage bin 345, and fine offset voltage bins 355 are not established until a count of ECC errors 469 for memory block 1 203 reaches a predetermined threshold (e.g., 1,000 ECC errors).

In one example, coarse offset voltage bins 345 and fine offset voltage bins 355 are established, and memory block 1 203 is assigned a coarse offset voltage bin 345 (e.g., coarse offset voltage bin B 349). In this example, memory block 1 203 is not re-assigned from coarse offset voltage bin B 349 to a selected one of fine offset voltage bins 355 until a count of ECC errors 469 for memory block 1 203 reaches a predetermined threshold (e.g., 1,000 ECC errors).

In one embodiment, the minimum voltage difference between coarse offset voltage bins 345 (e.g., coarse offset voltage bin A 347, coarse offset voltage bin B 349, . . . coarse offset voltage bin M 351) is an adjusted voltage (e.g., 200 millivolts for valley-n). In one example, a bit error rate (e.g., bit error rate 475) is determined (e.g., a bit error rate of $1 \times 10^{-15}$). The minimum voltage difference between coarse offset voltage bins 345 is adjusted to correspond to the determined bit error rate 475 (e.g., 180 millivolts), and memory blocks are assigned to the adjusted coarse offset voltage bins 345. In one embodiment, the bit error rate 475 is determined by an ECC decoder (not shown). In another embodiment, an ECC decoder generates an approximate measure of bit error rate.

In one embodiment, in advance of receiving commands for execution by memory device 470, a maximum amount of SCL per valley for a memory block is determined based on a number of program/erase cycles (e.g., program/erase cycles 471) of the memory block. The magnitude of the coarse offset voltage bin assigned to the memory block is based on the maximum amount of storage charge loss that is determined for the memory block.

In one embodiment, a margin (e.g., margin 473) is determined for reading memory cells 205 of memory device 470. For example, memory blocks with fewer program/erase cycles 471 may have more margin 473. In one example, assignment of offset voltages 311 may be disabled until a read error is determined to have occurred when margin 473 is determined to be greater than a predetermined threshold (e.g., 300 millivolts). In one example, when assignment of offset voltages is enabled, the number of offset voltage bins corresponds to an extent of margin 473.

In one embodiment, offset voltage bins with different resolutions may be defined for different memory die (not shown) within memory device 470. For example, a die with more margin 473 (e.g., 300 millivolts) may be assigned coarser resolution bins (e.g., fewer bins), and a die with less margin 473 (e.g., 100 millivolts) may be assigned finer resolution bins (e.g., more bins).

In one embodiment, assigning fine offset voltage bins to memory blocks is delayed until controller 480 has completed executing all commands (e.g., commands 467) received from host device 265.

Figure 5:
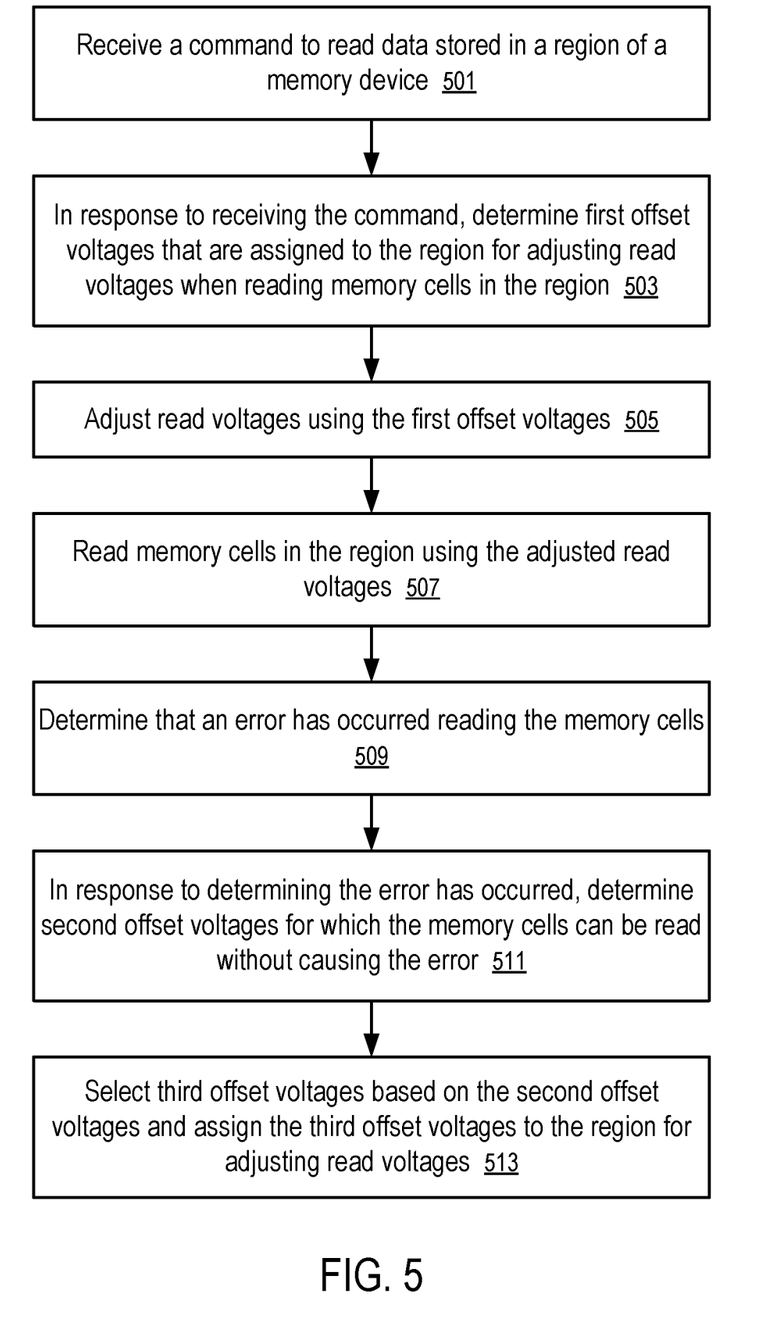
FIG. 5 shows a method to adjust memory cell read operations using offset voltages, according to one embodiment.

FIG. 5 shows a method to adjust memory cell read operations using offset voltages, according to one embodiment. The method of FIG. 5 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by memory sub-system controller 115 of FIG. 1, or local media controller 150 of FIG. 1.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1 with offset voltage bins 145 illustrated in FIGS. 1-4.

At block 501, a command to read data stored in a region of a memory device is received. In one example, the command is a read command. In one example, the region is a memory block (e.g., memory block 1 203).

At block 503, in response to receiving the command, first offset voltages assigned to the region for adjusting read voltages when reading memory cells in the region are determined. In one example, the first offset voltages are selected by a controller and are coarse offset voltages (e.g., coarse offset voltages selected from coarse offset voltage bin A 347).

In one embodiment, block 501 is optional, and the first offset voltages are determined in response to other events. Offset voltage manager 143 determines the bins (and corresponding offset voltages) by periodic foreground/background read operations. In one example, local media controller 150 itself initiates a read operation (without receiving a command from a host device). A read is performed using a read voltage adjusted by the first offset voltage.

At block 505, read voltages are adjusted using the first offset voltages. In one example, the first offset voltage for valley 6 is 200 millivolts. In one example, the read voltage for valley 6 is reduced by the first offset voltage for the valley (e.g., reduced by 200 millivolts).

At block 507, memory cells in the region are read using the adjusted read voltage. In one example, the read voltage for a valley is 1.8 volts and the adjusted read voltage for the valley is 1.6 volts.

At block 509, an error reading the memory cells is determined to have occurred. In one example, the read error is correctable using an error correction code (ECC) by using different offset values.

At block 511, in response to determining the error has occurred, second offset voltages for which the memory cells can be read without causing the error are determined. In one example, the second offset voltage for a valley-n is error correction read offset voltage 343 for the valley-n. In one example, the second offset voltage for valley-n is 260 millivolts.

At block 513, third offset voltages based on the second offset voltages are selected, and the third offset voltages are assigned to the region for adjusting read voltages. In one example, the third offset voltages are included in fine offset voltage bin B 359. In one example, the third offset voltage for valley 7 is 300 millivolts.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 6:
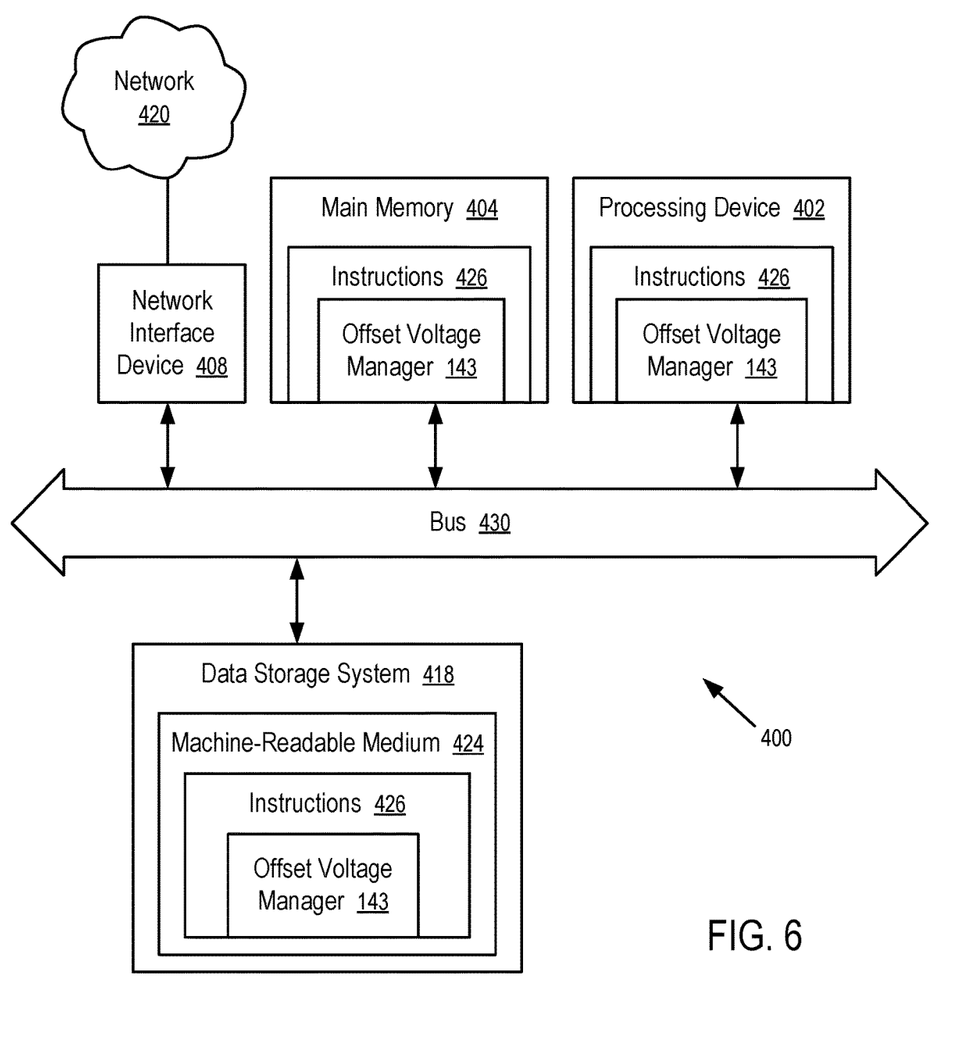
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of offset voltage manager 143 (e.g., to execute instructions to perform operations corresponding to the offset voltage manager 143 described with reference to FIGS. 1-4). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to offset voltage manager 143 (e.g., the offset voltage manager 143 described with reference to FIGS. 1-4). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

In one embodiment, a system includes: a storage media including regions of memory cells (e.g., memory cells 205); and a controller (e.g., local media controller 150) configured to: determine first offset voltages (e.g., one of coarse offset voltage bins 345) that is assigned to a first region (e.g., group of blocks) of the storage media for adjusting read voltages when reading memory cells in the first region; adjust, using the first offset voltage, read voltages for reading first memory cells (e.g., a page) in the first region; read, using the adjusted read voltages, the first memory cells; determine that an error has occurred in reading the first memory cells; in response to determining that the error has occurred, determine second offset voltages (e.g., error correction read offset voltage 343 for each valley-n) for which the first memory cells are read without the error; identify, based on the second offset voltages, third offset voltages (e.g., a newly-generated bin, or one of fine offset voltage bins 355); and assign the third offset voltages to the first region for adjusting read voltages to read memory cells in the first region.

In one embodiment, the first region is a memory block (e.g., memory block 1 203) of a flash memory device.

In one embodiment, the controller is further configured to: receive, from a host device (e.g., host device 265), a command (e.g., command 267) to read data stored in the first region. The first offset voltages are determined in response to receiving the command.

In one embodiment, the first memory cells are configured to be programmed in a multi-level cell (MLC) mode, a triple-level cell (TLC) mode, or a quad-level cell (QLC) mode.

In one embodiment, the controller is further configured to assign, in response to one or more read errors, offset voltages for adjusting read voltages when reading memory cells of the storage media.

In one embodiment, a first set of offset voltages includes the first offset voltages (e.g., coarse offset voltage bin A 347), a minimum of voltage differences between the offset voltages per valley of the first set is a first minimum (e.g., 200 millivolts), and the controller is further configured to: determine a number of errors (e.g., count of ECC errors 473) that have occurred in reading memory cells in the first region; determine that the number of errors is greater than a predetermined threshold (e.g., 1,000 errors); and in response to determining that the number of errors is greater than the predetermined threshold, generate a second set of offset voltages, where a minimum of voltage differences between the offset voltages of the second set is a second minimum (e.g., 100 millivolts), and the second minimum is less than the first minimum.

In one embodiment, the third offset voltage is selected from the second set.

In one embodiment, a method includes: receiving, from a host device by a controller, a command to read data stored in a region of a memory device; in response to receiving the command, determining first offset voltages that are assigned to the region for adjusting read voltages when reading memory cells in the region; adjusting, using the first offset voltages, read voltages (e.g., read voltage 1 209, etc.); reading first memory cells in the region using the adjusted read voltages; determining that an error has occurred in reading the first memory cells; in response to determining that the error has occurred, determining second offset voltages for which the first memory cells can be read without causing the error; selecting, based on the second offset voltages, third offset voltages; and assigning the third offset voltages to the region for adjusting read voltages.

In one embodiment, selecting the third offset voltages includes: comparing at least one of the second offset voltages to a first set of offset voltages, where the first set includes the first offset voltages (e.g., coarse offset voltage bin B 349); determining a voltage difference per valley between the first offset voltages and the second offset voltages; and determining that at least one of the voltage differences is less than a predetermined value (e.g., 50 millivolts). The third offset voltages are selected from the first set in response to determining that the one of the voltage differences is less than the predetermined value.

In one embodiment, selecting the third offset voltages includes: determining a minimum of voltage differences per valley between the second offset voltages and each offset voltage per valley in a first set of offset voltages (e.g., 60 millivolts); determining that the minimum is greater than a predetermined value (e.g., 50 millivolts); and in response to determining that the minimum is greater than the predetermined value, generating a second set of offset voltages, where a total number of offset voltages in the second set is greater than a total number of offset voltages in the first set.

In one embodiment, the third offset voltages are selected from the second set.

In one embodiment, the first offset voltages are included in a first set of offset voltages, and a minimum voltage difference between each offset voltage of the first set is a first minimum. Selecting the third offset voltages includes generating a second set of offset voltages, where a minimum voltage difference between each offset voltage of the second set is a second minimum, the second minimum is less than the first minimum, and the third offset voltages are selected from the second set.

In one embodiment, the first offset voltages are included in a first set having a first total number of offset voltages (e.g., three offset voltages). The method further includes:

generating a second set having a second total number of offset voltages (e.g., five offset voltages), where the second total number is greater than the first total number.

In one embodiment, selecting the third offset voltages includes selecting the offset voltage per valley from the second set that is closest in value to the second offset voltage per valley.

In one embodiment, a first set of offset voltages includes the first offset voltages and the third offset voltages, and a minimum voltage difference between each offset voltage per valley of the first set is a first minimum. The method further includes: determining a bit error rate; adjusting the first minimum to correspond to the determined bit error rate; and after adjusting the first minimum, assigning offset voltages of the first set to regions of the memory device (e.g., memory blocks 1-Y 203-223).

In one embodiment, a magnitude of the first offset voltage is based on a number of program/erase cycles.

In one embodiment, the method further includes: prior to receiving the command, determining, based on a number of program/erase cycles, a maximum amount of storage charge loss per valley corresponding to the region of the memory device; and determining a magnitude of the first offset voltage per valley corresponding to the first memory cells based on the maximum amount of storage charge loss per valley.

In one embodiment, the method further includes: prior to receiving the command, determining a storage charge loss per valley corresponding to the first memory cells; and determining a respective magnitude of the first offset voltages based on the storage charge loss per valley.

In one embodiment, the method further includes: determining a total offset voltage (e.g., total offset voltage 353) that corresponds to a maximum storage charge loss per valley for memory cells of the memory device; dividing the total offset voltage into voltage ranges, where each voltage range corresponds to at least one offset voltage for reading memory cells, and the first offset voltages per valley correspond to one of the voltage ranges; and assigning regions of the memory device to one of the voltage ranges.

In one embodiment, the method further includes: determining a margin (e.g., margin 471) for reading memory cells of the memory device; determining that the margin is greater than a predetermined threshold (e.g., 250 millivolts); and in response to determining that the margin is greater than the predetermined threshold, disabling assignment of offset voltages to regions of the memory device until determining that a read error has occurred. The total offset voltage per valley is divided into a number of voltage ranges, and the number of voltage ranges corresponds to an extent of the determined margin.

In one embodiment, the method further includes determining an extent of storage charge loss per valley for a group of blocks of the memory device. Selecting the respective third offset voltages is further based on the extent of storage charge loss per valley.

In one embodiment, a non-transitory computer-readable medium stores instructions which, when executed on at least one processing device, cause the at least one processing device to: determine first offset voltages that are assigned to a region of a memory device; adjust, using the first offset voltages, read voltages for reading pages in the region; read, using the adjusted read voltage, the pages; determine that an error has occurred in reading the pages; in response to determining that the error has occurred, identify second offset voltages used to read the pages without the error; determine, based on the second offset voltages, third offset voltages (e.g., a newly-generated bin or an existing bin); and assign the third offset voltages to the region for adjusting read voltages when reading pages in the region.

In one embodiment, the instructions further cause the at least one processing device to disable assignment of offset voltages, including disabling assignment of the third offset voltages, to regions of the memory device until determining that a read error has occurred.

In one embodiment, assigning the third offset voltages to the region is performed in response to determining, by a controller of the memory device, that execution for all commands (e.g., commands 467) received from the host device has been completed.

In one embodiment, a total amount of storage charge loss per valley is determined for a memory device. Coarse offset voltage bins are defined corresponding to the total amount of storage charge loss per valley. Memory regions are assigned to receive offset voltages from a coarse offset voltage bin corresponding to the amount of storage charge loss per valley in the memory region. For example, read voltages for the memory region are adjusted by the coarse offset voltages. In one example, an error occurs when reading data using read voltages adjusted using a coarse offset voltage bin. In one example, a new offset voltage bin are added to a bin table in response to the error, and the memory region is re-assigned to receive offset voltages from the new bin.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a storage media comprising regions of memory cells; and
a controller configured to:
  determine first offset voltages assigned to a first region of the storage media for adjusting read voltages when reading memory cells in the first region;
  adjust, using the first offset voltages, read voltages for reading first memory cells in the first region;
  read, using the adjusted read voltages, the first memory cells;
  determine that an error has occurred in reading the first memory cells;
  in response to determining that the error has occurred, determine second offset voltages for which the first memory cells are read without the error;
  determine third offset voltages using offset voltages selected from the second offset voltages; and
  assign the third offset voltages to the first region for adjusting read voltages to read memory cells in the first region.

2. The system of claim 1, wherein:
the first region is a memory block of a flash memory device;
the first offset voltages are selected from a first bin;
the second offset voltages are selected from a second bin;
determining the third offset voltages comprises generating a new bin that includes the third offset voltages; and
assigning the third offset voltages comprises assigning the new bin to the first region.

3. The system of claim 1, wherein the controller is further configured to:
receive, from a host device, a command to read data stored in the first region;
wherein the first offset voltages are determined in response to receiving the command.

4. The system of claim 1, wherein:
the first offset voltages are stored in a first bin; and
the second offset voltages are stored in a second bin.

5. The system of claim 1, wherein the controller is further configured to assign, in response to one or more read errors, offset voltages for adjusting read voltages when reading memory cells of the storage media.

6. The system of claim 1, wherein a first bin of offset voltages includes the first offset voltages, a minimum of voltage differences between the offset voltages of the first bin is a first minimum, and the controller is further configured to:
determine a number of errors that have occurred in reading memory cells in the first region;
determine that the number of errors is greater than a predetermined threshold; and
in response to determining that the number of errors is greater than the predetermined threshold, generate a second bin of offset voltages, wherein a minimum of voltage differences between the offset voltages of the second set is a second minimum, and the second minimum is less than the first minimum;
wherein the third offset voltages are assigned from the second bin.

7. A method comprising:
receiving, from a host device by a controller, a command to read data stored in a region of a memory device;
in response to receiving the command, determining first offset voltages that are assigned to the region for adjusting read voltages when reading memory cells in the region;
adjusting, using the first offset voltages, read voltages;
reading first memory cells in the region using the adjusted read voltages;
determining that an error has occurred in reading the first memory cells;
in response to determining that the error has occurred, determining second offset voltages for which the first memory cells can be read;
determining third offset voltages using offset voltages selected from the second offset voltages; and
assigning the third offset voltages to the region for adjusting read voltages.

8. The method of claim 7, wherein:
an existing bin includes the third offset voltages;
determining the third offset voltages comprises:
    determining a voltage difference between one of the third offset voltages for a valley, and one of the second offset voltages for the valley; and
    determining that the voltage difference is less than a predetermined value; and
assigning the third offset voltages comprises assigning the existing bin to the region.

9. The method of claim 7, wherein determining the third offset voltages comprises:
determining a voltage difference between one of the second offset voltages for a valley, and an offset voltage for the valley in an existing bin of offset voltages;
determining that the voltage difference is greater than a predetermined value; and
in response to determining that the voltage difference is greater than the predetermined value, generating a new bin of offset voltages;
wherein the new bin is assigned to the region.

10. The method of claim 7, wherein:
the controller assigns offset voltages to regions of the memory device using existing bins; and
determining the third offset voltages comprises generating a new bin of offset voltages, wherein the new bin is added to the existing bins for use by the controller in assigning offset voltages to regions of the memory device with an increased voltage resolution; and
assigning the third offset voltages comprises assigning the new bin to the region.

11. The method of claim 7, wherein the first offset voltages are included in a first bin of offset voltages, the method further comprising:
generating a second bin of offset voltages;
wherein determining the third offset voltages comprises assigning the second bin to the region.

12. The method of claim 7, wherein the controller assigns existing bins to regions of the memory device, the method further comprising:
determining a bit error rate when reading memory cells of the memory device; and
increasing a number of the existing bins based on the determined bit error rate.

13. The method of claim 7, wherein:
magnitudes of the first offset voltages are based on a number of program/erase cycles; and
the first memory cells are configured to be programmed in a multi-level cell (MLC) mode, a triple-level cell (TLC) mode, or a quad-level cell (QLC) mode.

14. The method of claim 7, further comprising:
prior to receiving the command, determining a storage charge loss for a valley corresponding to the first memory cells; and
determining magnitudes of offset voltages for the valley based on the storage charge loss.

15. The method of claim 7, further comprising:
determining a maximum storage charge loss for a valley;
determining, based on the maximum storage charge loss, offset voltages for the valley used in existing bins managed by the controller; and
assigning, by the controller, regions of the memory device to one of the existing bins.

16. The method of claim 15, further comprising:
determining a margin for reading memory cells of the memory device;
determining that the margin is greater than a predetermined threshold; and
in response to determining that the margin is greater than the predetermined threshold, disabling assignment of offset voltages to regions of the memory device until determining that a read error has occurred.

17. The method of claim 7, further comprising:
determining an extent of storage charge loss for a valley used for reading memory cells of the memory device;
wherein determining the third offset voltages is further based on the extent of storage charge loss for the valley.

18. A non-transitory computer-readable medium storing instructions which, when executed on at least one processing device, cause the at least one processing device to:
determine first offset voltages of a first bin that is assigned to a block of a memory device;
adjust, using the first offset voltages, read voltages for reading memory cells in the block;
read, using the adjusted read voltages, the memory cells;
determine that at least one error has occurred in reading the memory cells;
in response to determining that the error has occurred, identify second offset voltages used to read the memory cells without the error;
determine third offset voltages of a second bin using offset voltages selected from the second offset voltages; and
assign the second bin to the block for adjusting read voltages when reading memory cells in the block.

19. The non-transitory computer-readable medium of claim 18, wherein:
the second bin is selected from existing bins, or the second bin is generated as a new bin when determining the third offset voltages; and
the instructions further cause the at least one processing device to disable assignment of offset voltages, including disabling assignment of the third offset voltage, to blocks of the memory device until determining that a read error has occurred.

20. The non-transitory computer-readable medium of claim 18, wherein assigning the third offset voltages to the block is performed in response to determining, by a controller of the memory device, that execution for all commands received from the host device has been completed.

* * * * *